US006087268A

United States Patent [19]

Holloway et al.

[11] Patent Number: 6,087,268

[45] Date of Patent: Jul. 11, 2000

[54] METHOD TO REDUCE BORON DIFFUSION THROUGH GATE OXIDE USING SIDEWALL SPACERS

[75] Inventors: Thomas C. Holloway, Murphy; Douglas T. Grider, McKinney, both of Tex.

[73] Assignee: Texas Instruments Incorporated, Dallas, Tex.

[21] Appl. No.: 09/237,762

[22] Filed: Jan. 26, 1999

Related U.S. Application Data

[60] Provisional application No. 60/072,671, Jan. 27, 1998.

[51] Int. Cl.[7] .......... H01L 21/00

[52] U.S. Cl. .......... 438/724; 438/744

[58] Field of Search .......... 438/719, 724, 438/744, 740, 197, 265; 216/67, 79

[56] References Cited

U.S. PATENT DOCUMENTS

| | | | |
|---|---|---|---|
| 5,756,216 | 5/1998 | Becker et al. | 438/744 X |
| 5,965,462 | 10/1999 | Tan et al. | 438/724 X |
| 6,025,255 | 2/2000 | Chen et al. | 438/724 X |

*Primary Examiner*—William Powell
*Attorney, Agent, or Firm*—Mark A. Valetti; Carlton H. Hoel; Frederick J. Telecky, Jr.

[57] ABSTRACT

A gate electrode of a MOS transistor wherein gate oxide 12 is placed over substrate 10. Boron-doped polysilicon gate electrode 14 is placed over gate oxide 12. Optionally, drain extender implants may be added to substrate 10. Low-temperature-deposited nitride layer 18 is placed over gate electrode 14 and gate oxide 12. The structure then undergoes a sidewall spacer etch to form sidewall spacers 20.

19 Claims, 1 Drawing Sheet

METHOD TO REDUCE BORON DIFFUSION THROUGH GATE OXIDE USING SIDEWALL SPACERS

This application claims priority under 35 USC §119(e) (1) of Provisional application No. 60/072,671 filed Jan. 27, 1998.

TECHNICAL FIELD OF THE INVENTION

This invention relates, in general, to method for reducing boron diffusion through a gate oxide. More specifically, this invention relates to a method for reducing boron diffusion through a gate oxide during the creation of sidewall spacers adjacent to the gate electrode.

BACKGROUND OF THE INVENTION

Without limiting the scope of the invention, its background is described in connection with a method for reducing boron diffusion through a gate oxide layer.

Integrated circuits using MOS transistors are used in many modern devices, including not only radios, TV, and stereos but less obvious items such as automobiles and microwaves. Integrated circuits are manufactured by processes involving hundreds of steps and these processes continue to evolve.

Recently, it has been determined that silicon nitride spacers are desirable in MOS transistor design since silicon nitride can be anisotropically etched with selectivity to the underlying oxide so that the silicon surface is not exposed to the etchants and excessive removal of oxide is minimized. Additionally, this nitride is not etched by subsequent oxide clean-ups and will serve as an etch barrier minimizing, e.g. source/drain shorting to the gate.

SUMMARY OF THE INVENTION

Silicon nitride sidewall spacers are desirable in MOS transistor design. Silicon nitride can be etched with selectivity to the underlying oxide so that the silicon surface is not exposed to the oxide etchants and excessive removal of oxide is minimized. Additionally, this nitride is not etched by subsequent oxide clean-ups and will serve as an etch barrier minimizing problems such as source/drain shorting to the gate.

With shrinking transistor sizes, and the development of ultra-thin gate oxides, it has now been found that the deposition of a high-quality silicon nitride film-which has heretofore been formed using LPCVD at relatively high temperatures (700–800° C.) in a hydrogen-containing ambient for long periods of time-can result in boron doping in the gate electrode diffusing through the thin gate oxide causing threshold voltage control problems, or, if little or no boron doping is used in the polysilicon gate electrode prior to spacer formation-resulting in reduced gate-to-channel capacitance and lower transistor performance.

The present invention involves the use of relatively rapid, low-temperature processes such as plasma enhanced deposition to form a silicon nitride sidewall spacer adjacent the gate electrode. This reduces boron diffusion from boron-doped polysilicon gate electrode.

The method of this invention can use a deposition of silicon nitride, such as plasma enhanced chemical vapor deposition (PECVD) or high density plasma (HDP) deposition in order to significantly reduce the deposition temperature and/or the deposition time through increased deposition rates of the enhanced process. This reduces the problem of boron diffusion through the gate oxide.

In cases where especially high quality nitride is required, a subsequent rapid thermal annealing (RTA) step can be used to achieve the desired film properties. As the RTA anneal is of short duration, the overall diffusion of boron through the gate oxide is still significantly reduced over the current LPCVD process.

The present invention can involve a low temperature method for reducing boron diffusion through a gate oxide, comprising the steps of forming a gate oxide over a substrate layer, forming a boron-doped polysilicon gate electrode over said gate oxide, isotropically forming a nitride layer over said gate electrode and at a temperature of less than about 600° C., and anisotropically etching said nitride layer in a manner that leaves a nitride sidewall spacer adjacent to said gate electrode.

In one embodiment, the step of forming a nitride layer is accomplished by using a high density plasma deposition performed at a temperature less than about 400° C.

In another embodiment, the step of forming a nitride layer is accomplished using plasma enhanced chemical vapor deposition performed at a temperature greater than about 400° C.

Still another embodiment is when the step of forming a nitride layer is accomplished using jet vapor deposition performed at a temperature of less than about 500° C.

BRIEF DESCRIPTION OF THE DRAWINGS

For a complete understanding of the present invention, including its features and advantages, reference is now made to the detailed description of the invention taken in conjunction with the accompanying drawings in which like numerals identify like parts and in which.

DETAILED DESCRIPTION OF THE INVENTION

Figure 1A:
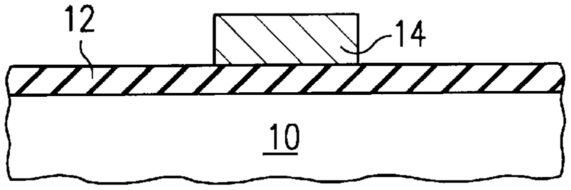
FIGS. 1A–1D are simplified cross-sectional views of the fabrication of a MOS transistor.
Figure 1B:
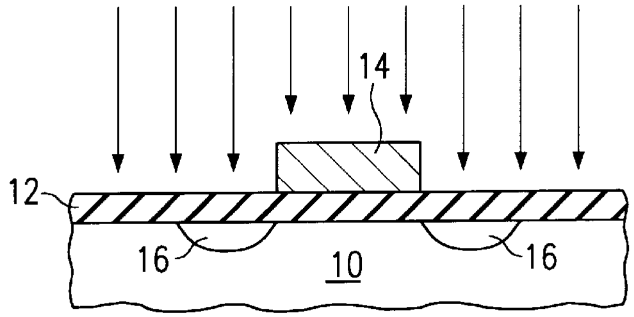
Figure 1C:
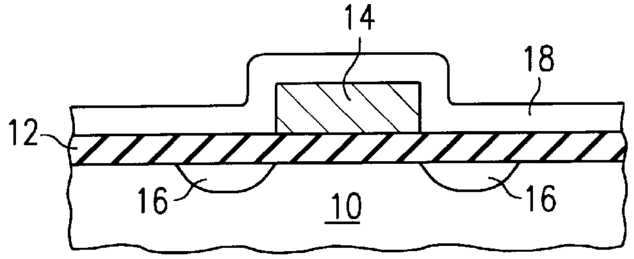
Figure 1D:
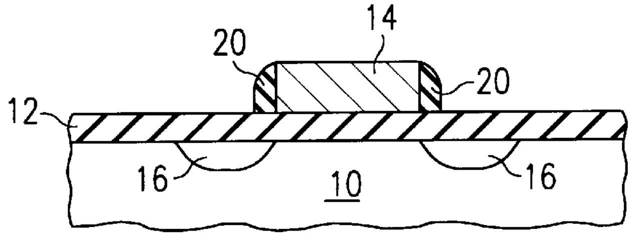

FIGS. 1A–1D show simplified cross-sections of one embodiment of the fabrication of a gate electrode of a MOS transistor. In FIG. 1A, gate oxide 12 is grown on substrate 10. Boron-doped, polysilicon gate electrode 14 is deposited and patterned over gate oxide 12. In FIG. 1B, source/drain moderately-doped extender implants may be added to substrate 10 prior to sidewall formation. The extender step is optional and not critical to the invention. In FIG. 1C, a conformal nitride layer 18 is isotropically placed over gate electrode 14 and gate oxide 12. In FIG. 1D, the structure in FIG. 1C undergoes an anisotropic sidewall spacer etch to form sidewall spacer 20. Highly-doped source drain implants can be added after the formation of the sidewall spacer 20.

Alternatively, polysilicon gate electrode 14 may be boron-doped after deposition of gate electrode 14. In some embodiments, gate oxide 12 may be partially nitrided. The term "gate oxide" as used herein includes partially nitrided gate oxides.

Preferably, plasma enhanced chemical vapor deposition is performed in the absence of hydrogen. Also, preferably, the plasma enhanced chemical vapor deposition is performed using $SiBr_4$ or $NF_3$.

One method of depositing a nitride layer at relatively low temperature is high density plasma (HDP) deposition. The term "low temperature" as used herein means temperatures less than about 600° C. Historically, capacitively coupled plasma discharges have been used in semiconductor processing. These discharges are characterized by relatively low ion densities. They do not permit independent control of ion density and energy. The semiconductor processing industry has been moving toward high density plasma sources operating at pressures lower than $10^{-2}$ Torr generating ion densities of $10^{11}/cm^3$. The motivation for HDP sources is two-fold: manufacturing constraints and plasma requirements. HDP sources provide the improved process margins necessary for submicron technologies. Numerous technologies have been employed to achieve these HDP discharges including: electron cyclotron resonance (ECR), radio frequency (RF) induction, inductively or transformer coupled plasmas (ICP/TCP), and helicon wave.

Another method of nitride deposition at relatively low temperature is plasma enhanced chemical vapor deposition (PECVD). When gas is enhanced by a high enough electric field, a glow discharge (plasma) is formed. In the plasma, high-energy electrons exist that can impart enough energy to reaction gases for reactions that normally take place only at high temperature to proceed near room temperature. In plasma enhanced chemical vapor deposition, inlet gas contains the reactants for deposition. The glowing (plasma) region will contain, in addition to the free electrons, normal neutral gas molecules, gas molecules that have become ionized, ionized fragments of broken-up gas molecules, and free radicals. Deposition occurs when the molecules of incoming gases are broken in the plasma and then the appropriate ions are recombined at the surface to give the desired film.

Jet Vapor Deposition (JVD) is a new process which uses an inert gas jet in combination with a resistive evaporation source to concentrate and deposit-under low vacuum (≈1–10 Torr) conditions-various materials, with high local efficiencies. By using multiple jets and reactive co-deposition concepts, the JVD process offers considerable potential for economically creating monolithic and laminated film coatings on flat and fiber substrates.

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention, and do not delimit the scope of the invention.

What is claimed is:

1. A low temperature method for reducing boron diffusion through a gate oxide, comprising the steps of:

forming a gate oxide over a substrate layer;

forming a boron-doped polysilicon gate electrode over said gate oxide;

isotropically forming a nitride layer over said gate electrode at a temperature of less than about 600° C.; and anisotropically etching said nitride layer in a manner that leaves a nitride sidewall spacer adjacent to said gate electrode.

2. The method as recited in claim 1, wherein said step of forming a nitride layer is performed using a method selected from the group consisting of high density plasma deposition, high density plasma deposition, and jet vapor deposition.

3. The method as recited in claim 1, wherein said step of forming a nitride layer is performed using high density plasma deposition.

4. The method as recited in claim 3, wherein said step of forming a nitride layer using high density plasma deposition is performed at a temperature less than about 400° C.

5. The method as recited in claim 3, additionally comprising the step of annealing, by RTA annealing, after said step of forming a nitride layer.

6. The method as recited in claim 3, additionally comprising the step of implanting an extended drain structure before said step of forming a nitride layer.

7. The method as recited in claim 3, additionally comprising the step of RTA annealing after said step of etching said nitride layer.

8. The method as recited in claim 1, where said step of forming a nitride layer is performed using plasma enhanced chemical vapor deposition.

9. The method as recited in claim 8, wherein said step of forming a nitride layer using plasma enhanced chemical vapor deposition is performed at a temperature greater than about 400° C.

10. The method as recited in claim 8, additionally comprising the step of annealing, by RTA annealing, after said step of forming a nitride layer.

11. The method as recited in claim 8, additionally comprising the step of implanting an extended drain structure before said step of forming a nitride layer.

12. The method as recited in claim 8, additionally comprising the step of RTA annealing after said step of etching said nitride layer.

13. The method as recited in claim 1, where said step of forming a nitride layer is performed using jet vapor deposition.

14. The method as recited in claim 13, wherein said step of forming a nitride layer using jet vapor deposition is performed at a temperature of less than about 500° C.

15. The method as recited in claim 13, additionally comprising the step of annealing, by RTA annealing, after said step of forming a nitride layer.

16. The method as recited in claim 13, additionally comprising the step of implanting an extended drain structure before said step of forming a nitride layer.

17. The method as recited in claim 13, additionally comprising the step of RTA annealing after said step of etching said nitride layer.

18. The method as recited in claim 8, wherein said plasma enhanced chemical vapor deposition is performed in the absence of hydrogen.

19. The method as recited in claim 18, wherein said plasma enhanced chemical vapor deposition is performed using $SiBr_4$ or $NF_3$.

* * * * *